(12) United States Patent
Liebermann et al.

(10) Patent No.: US 8,193,344 B2
(45) Date of Patent: Jun. 5, 2012

(54) PROCESS FOR MAKING ORGANIC PHOTOSENSITIVE PIGMENT

(75) Inventors: George Liebermann, Mississauga (CA); Marko Saban, Toronto (CA); Sandra Gardner, Oakville (CA); Cuong Vong, Hamilton (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 12/968,215

(22) Filed: Dec. 14, 2010

(65) Prior Publication Data

US 2011/0087020 A1    Apr. 14, 2011

Related U.S. Application Data

(62) Division of application No. 11/706,609, filed on Feb. 14, 2007, now Pat. No. 7,888,501.

(51) Int. Cl.
*C07B 47/00* (2006.01)
*C07D 487/22* (2006.01)

(52) U.S. Cl. ...................................................... 540/145
(58) Field of Classification Search .................. 540/145
See application file for complete search history.

(56) References Cited

U.S. PATENT DOCUMENTS

| | | |
|---|---|---|
| 3,121,006 A | 2/1964 | Middleton et al. |
| 5,153,094 A | 10/1992 | Kazmaier et al. |
| 5,153,313 A | 10/1992 | Kazmaier et al. |
| 5,164,493 A | 11/1992 | Mayo et al. |
| 5,166,339 A | 11/1992 | Duff et al. |
| 5,182,382 A | 1/1993 | Mayo et al. |
| 5,189,156 A | 2/1993 | Mayo et al. |
| 5,206,359 A | 4/1993 | Mayo et al. |
| 5,288,574 A | 2/1994 | Desilets et al. |
| 5,384,222 A | 1/1995 | Normandin et al. |
| 5,512,674 A | 4/1996 | Nukada et al. |
| 6,232,466 B1 | 5/2001 | Daimon et al. |
| 7,888,501 B2 * | 2/2011 | Liebermann et al. ......... 540/145 |
| 2006/0105254 A1 | 5/2006 | Wu et al. |

FOREIGN PATENT DOCUMENTS

| | | |
|---|---|---|
| EP | 0 460 565 A2 | 12/1991 |
| EP | 0 508 772 A1 | 10/1992 |
| EP | 1 672 034 A1 | 6/2006 |

OTHER PUBLICATIONS

European Search Report dated May 15, 2008 for EP Application No. 08151299.8, 7 pages.

* cited by examiner

*Primary Examiner* — Paul V. Ward
(74) *Attorney, Agent, or Firm* — Pillsbury Winthrop Shaw Pittman LLP

(57) ABSTRACT

Processes for making photosensitive organic pigments for use in imaging members, specifically processes for making a photosensitive phthalocyanine pigments having a specific crystal form, comprising dissolving the pigment in a mixture of a haloacetic acid and alkylene halide to form a solution, precipitating the pigment by adding the solution to a non-solvent system, the solution comprised of one or more organic solvents and a small amount of water, wherein the amount of water controls the crystal form of the pigment, followed by a treatment with a halobenzene to obtain a highly photosensitive second crystal form of the pigment.

20 Claims, 5 Drawing Sheets

PROCESS FOR MAKING ORGANIC PHOTOSENSITIVE PIGMENT

RELATED APPLICATIONS

This application is a Divisional of U.S. application Ser. No. 11/706,609, filed Feb. 14, 2007 U.S. Pat. No. 7,888,501, which is expressly incorporated by reference.

TECHNICAL FIELD

The present disclosure relates generally to organic photosensitive pigments used in imaging members, such as layered photoreceptor devices, and novel processes for producing the pigments. The imaging members can be used in electrophotographic, electrostatographic, xerographic and like devices, including printers, copiers, scanners, facsimiles, and including digital, image-on-image, and like devices. More specifically, the present embodiments relate to processes for controlling the polymorph of the organic photosensitive pigment, specifically titanyl phthalocyanine (TiOPc) with consistent polymorph as illustrated by its X-ray diffraction pattern (XRPD), particle size and high photosensitivity.

BACKGROUND

Electrophotographic imaging members, e.g., photoreceptors, typically include a photoconductive layer formed on an electrically conductive substrate. The photoconductive layer is an insulator in the substantial absence of light so that electric charges are retained on its surface. Upon exposure to light, charge is generated by the photoactive or photosensitive pigment, and under applied field charge moves through the photoreceptor and the charge is dissipated.

In electrophotography, also known as xerography, electrophotographic imaging or electrostatographic imaging, the surface of an electrophotographic plate, drum, belt or the like (imaging member or photoreceptor) containing a photoconductive insulating layer on a conductive layer is first uniformly electrostatically charged. The imaging member is then exposed to a pattern of activating electromagnetic radiation, such as light. Charge generated by the photoactive pigment move under the force of the applied field. The movement of the charge through the photoreceptor selectively dissipates the charge on the illuminated areas of the photoconductive insulating layer while leaving behind an electrostatic latent image. This electrostatic latent image may then be developed to form a visible image by depositing oppositely charged particles on the surface of the photoconductive insulating layer. The resulting visible image may then be transferred from the imaging member directly or indirectly (such as by a transfer or other member) to a print substrate, such as transparency or paper. The imaging process may be repeated many times with reusable imaging members.

An electrophotographic imaging member may be provided in a number of forms. For example, the imaging member may be a homogeneous layer of a single material such as vitreous selenium or it may be a composite single layer containing charge photogenerating and charge transporting compounds and other materials. In addition, the imaging member may be layered. These layers can be in any order, and sometimes can be combined in a single or mixed layer.

Typical multilayered photoreceptors have at least two layers, and may include a substrate, a conductive layer, an optional charge blocking layer, an optional adhesive layer, a photogenerating layer (sometimes referred to as, and used herein interchangeably, a "charge generation layer," "charge generating layer," or "charge generator layer"), a charge transport layer, an optional overcoating layer and, in some belt embodiments, an anticurl backing layer. In the multilayer configuration, the active layers of the photoreceptor are the charge generating layer (CGL) and the charge transport layer (CTL).

As more advanced, higher speed electrophotographic copiers, duplicators and printers were developed, however, degradation of image quality was encountered during extended cycling. The complex, highly sophisticated duplicating and printing systems operating at very high speeds have placed stringent requirements, including narrow operating limits, on the imaging members. Thus, photoreceptor materials are required to exhibit, efficient charge generation and charge transport properties, and structural integrity and robustness so as to withstand mechanical abrasion during image development cycles.

Organic photosensitive pigments are widely used as photoactive components in charge generating layers. One such pigment used in the charge generating layer in electrophotographic devices is titanyl phthalocyanines or oxytitanium phthalocyanine (TiOPc). As explained, for example, in U.S. Pat. No. 5,164,493, which is hereby incorporated by reference in its entirety, polymorphism or the ability to form distinct solid state forms is well known in phthalocyanines and will affect its photoactive properties. There are several TiOPc crystal forms, or polymorphs, known to be useful in photoreceptor devices. For example, some crystal forms of TiOPc are described as Types I, II, III, X, Y and IV or V. TiOPc Type IV or Type V offer many attractive features as a photosensitive pigment, and they are especially of interest because of their high efficiency of charge generation. As such, TiOPc Type IV is incorporated into photoreceptor layers, such as disclosed in U.S. Pat. Nos. 5,164,493 and 5,384,222, which are hereby incorporated by reference in their entirety. Many processes for making the various crystal forms of TiOPc are disclosed in the literature. In general the processes involve the synthesis of the TiOPc as a first step. The desired polymorph, with the preferred photoactive properties, XRPD pattern and particle size is then obtained from the "as synthesized" TiOPc, usually Type I or II, in a second process step which involves the dissolution of the TiOPc in specific acidic solvent systems, followed by a precipitation in a non-solvent mixture or system. Further purification and solvent treatment of the material is usually required to obtain the desired photoactive properties. Such processes where the "as synthesized" TiOPc is dissolved in sulfuric acid, prior to precipitation and further purification, are described in U.S. Pat. Nos. 5,512,674 and 6,232,466 which are hereby incorporated by reference in their entirety. Other processes where the "as synthesized" TiOPc is dissolved in a mixture of haloacetic acid and alkylene halide, prior to precipitation and further purification, are described in U.S. Pat. Nos. 5,153,094, 5,153,313, 5,166,339, 5,189,156 and 5,182,382, which are hereby incorporated by reference in their entirety. These patents also describe the use of several non-solvent mixtures or systems to precipitate the dissolved TiOPc in order to obtain the desired crystal form, particle size and photoactive properties. The non-solvent system used is generally described as determining the type of crystal form obtained during the precipitation step, while another solvent treatment after the precipitation may also affect the polymorph, as well as the photoactive properties. Thus non-solvent systems used in the precipitation step described in the above mentioned patents include water, mixtures of water and an alcohol, an alcohol, a diol or a mixture of alcohol and alkylene halide. One of the preferred post precipitation treatments is the use of a halobenzene. Thus, U.S. Pat. No. 5,206, 359, which is hereby incorporated by reference in its entirety, describes the use of a dissolution mixture comprised of a haloacetic acid and alkylene halide, a precipitation solvent mixture of an alcohol and water to obtain an intermediate crystal form TiOPc designated as Type X, followed by a treatment with a halobenzene to obtain the desired photoactive TiOPc crystal form identified as Type IV. U.S. Patent Publication No. 2006/0105254, which is hereby incorporated by reference in its entirety, describes the use of a dissolution mixture comprised of a haloacetic acid and alkylene halide, a precipitation solvent mixture of an alcohol and alkylene halide to precipitate an intermediate crystal form of TiOPc, assigned as type Y, followed by a treatment with monochlorobenzene to obtain the desired photoactive crystal form of TiOPc, identified as Type Y.

The control of the crystal form of phthalocyanines, such as titanyl phthalocyanine (TiOPc) is critical for obtaining the desired photoactive properties, such as high photosensitivity. Processes for obtaining phthalocyanines for electrophotographic application are generally complex, multistep processes and therefore the ability of obtaining the final product with all the right properties may not be very reproducible. Processes that involve obtaining an intermediate crystal form of the phthalocyanine are even more challenging: if the intermediate crystal form is not the right one, then the solvent treatment will generally not yield the desired crystal form of the phthalocyanine. Thus, there is a need for processes which improve the crystal form control of the phthalocyanines, such as TiOPc, which will result in a consistent and reproducible process for obtaining the desired crystal form and photoactive properties.

BRIEF SUMMARY

According to embodiments illustrated herein, there is provided improved processes for making a photosensitive pigment for use in electrophotographic applications that address the shortcomings discussed above.

In one embodiment, there is provided an improved process for preparing a phthalocyanine pigment having a specific crystal form, comprising dissolving a pigment in a solvent mixture of a haloacetic acid and alkylene halide to form a solution, and precipitating the pigment to a crystal form by adding the solution to a non-solvent mixture, the non-solvent mixture comprising one or more organic solvents and a small amount of water, wherein a presence of water controls the resulting crystal form of the pigment.

In another embodiment, there is provided an improved process for preparing a photosensitive phthalocyanine pigment having a specific crystal form, comprising dissolving a pigment in a solvent mixture of a haloacetic acid and alkylene halide to form a solution, precipitating the pigment to a crystal form by adding the solution to a non-solvent mixture, the non-solvent mixture comprising one or more organic solvents and a small amount of water, wherein the amount of water controls the resulting crystal form of the pigment, and converting the pigment to a second crystal form by treatment with a halobenzene, wherein the second crystal form is highly photosensitive.

Yet another embodiment provides an improved process for preparing a photosensitive phthalocyanine pigment having a specific crystal form, comprising dissolving titanyl phthalocyanine Type I in a solvent mixture of trifluoroacetic acid and methylene chloride to form a solution, adding the solution to a non-solvent mixture of methanol, methylene chloride and a small amount of de-ionized water to initiate precipitation of titanyl phthalocyanine Type X, and treating the titanyl phthalocyanine Type X with monochlorobenzene to form titanyl phthalocyanine Type IV. In embodiments, the above process further includes a step of using the amount of water to control the resulting crystal form of the pigment. In other embodiments, the above process further includes a step of adjusting a ratio of methanol to methylene chloride in the non-solvent mixture to control particle size of the titanyl phthalocyanine Type X.

BRIEF DESCRIPTION OF THE DRAWINGS

For a better understanding of the present embodiments, reference may be had to the accompanying figures.

DETAILED DESCRIPTION

It is understood that other embodiments may be utilized and structural and operational changes may be made without departure from the scope of the embodiments disclosed herein.

The embodiments relate to processes for making organic photosensitive pigments, namely, titanyl phthalocyanine (TiOPc) Type IV, with good charge generation for use in the formulation of a charge generating layer. In embodiments, improved processes are described that consistently produce the desired crystal forms of titanyl phthalocyanine, therefore providing better control in producing the desired TiOPc properties, such as for example, high photosensitivity, consistent particle size, and the like.

There are existing processes used for converting TiOPc Type I to photoreceptor grade TiOPc Type IV. One process, described in U.S. Pat. No. 5,512,674, begins by dissolving TiOPc Type I in sulfuric acid, followed by adding the mixture to methanol/de-ionized water to precipitate the formation of an amorphous pigment. The pigment is subsequently washed with dilute ammonium hydroxide and de-ionized water, followed by a treatment with a mixture of monochlorobenzene and water at 40° C., and a final methanol wash. The final step in the process is drying the pigment under vacuum. Another process, described in U.S. Pat. No. 5,164,493, begins by dissolving TiOPc Type I in a mixture of trifluoroacetic acid (TFA) and methylene chloride, followed by adding the mixture to methanol/de-ionized water to precipitate the formation of TiOPc Type X. The pigment is subsequently washed with hot and cold de-ionized water, followed by a treatment with neat monochlorobenzene at room temperature, and a final methanol wash. The final step in the process is drying the pigment under vacuum. In a third process, described in U.S. Patent Application No. 2006/0105254, a mixture of methanol/methylene chloride is used for precipitating the pigment in place of the methanol/de-ionized water with the formation of TiOPc Type Y. The pigment is subsequently washed with hot and cold de-ionized water, followed by a treatment with neat monochlorobenzene to yield a photosensitive titanyl phthalocyanine (TiOPC Type V). Each of the above patents and patent applications are hereby incorporated by reference in their entirety.

Figure 1:
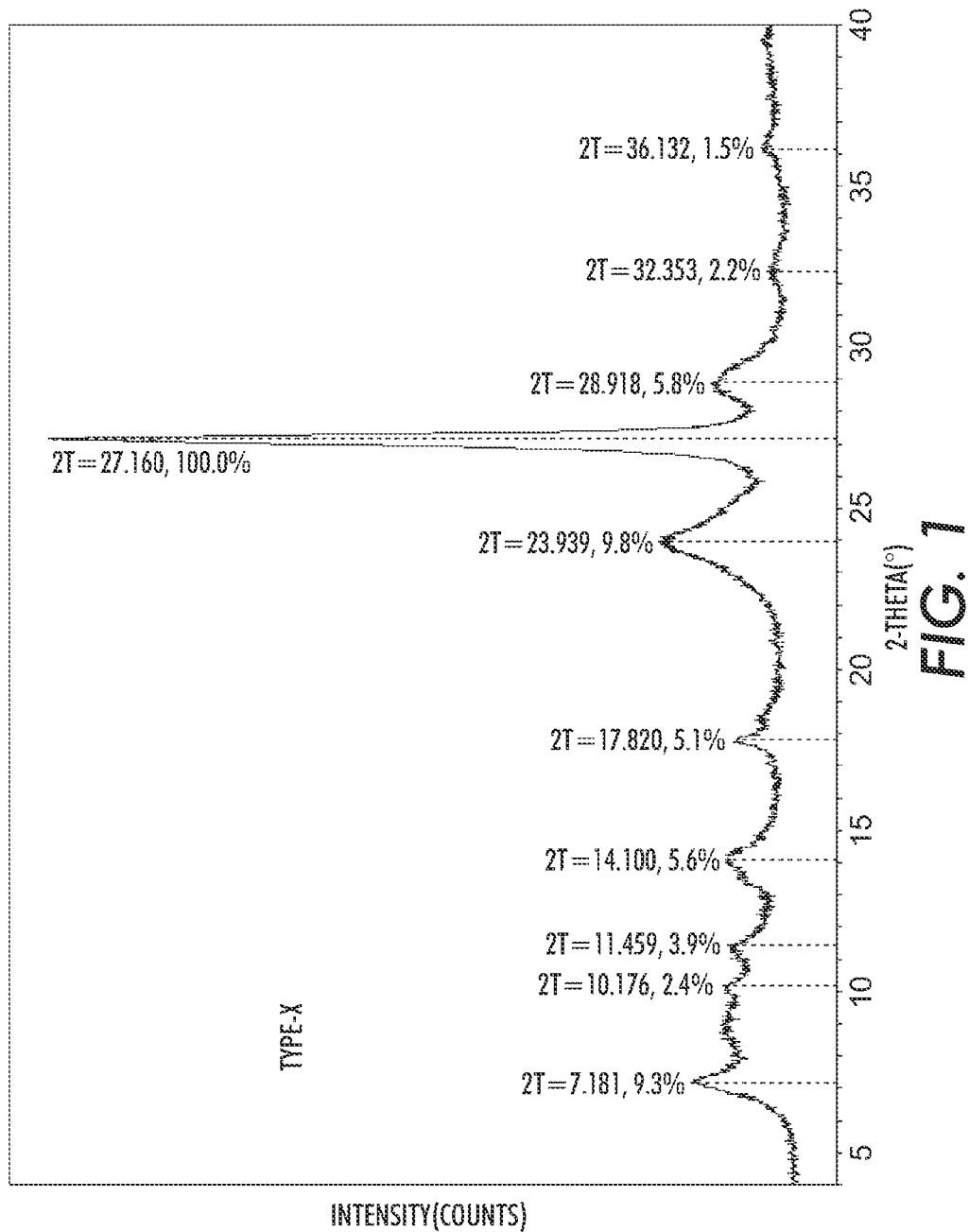
FIG. 1 is a diffractograph of the XRPD of titanyl phthalocyanine (TiOPc) Type X.
Figure 2:
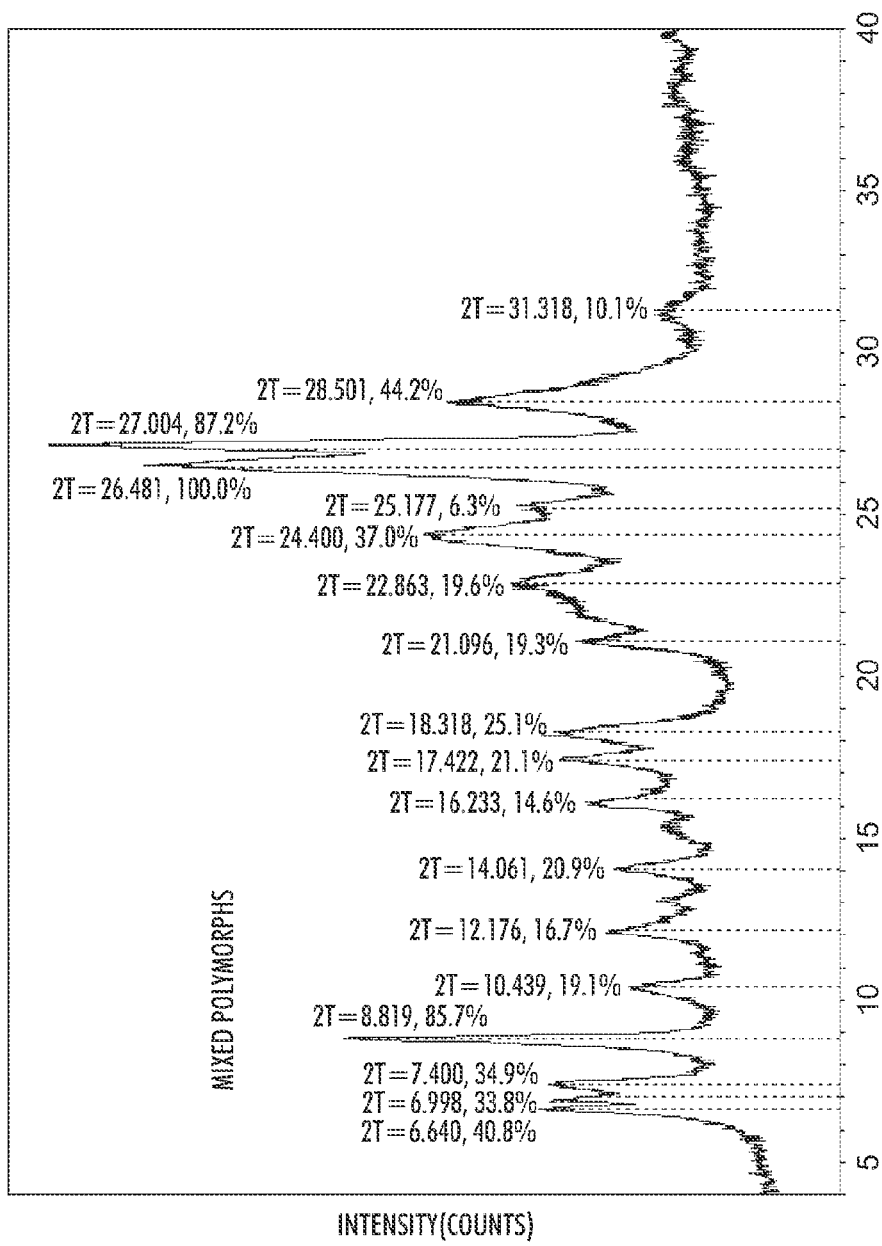
FIG. 2 is a diffractograph of the XRPD of an undesired mixture of titanyl phthalocyanine (TiOPc) crystal forms (polymorphs)
Figure 3:
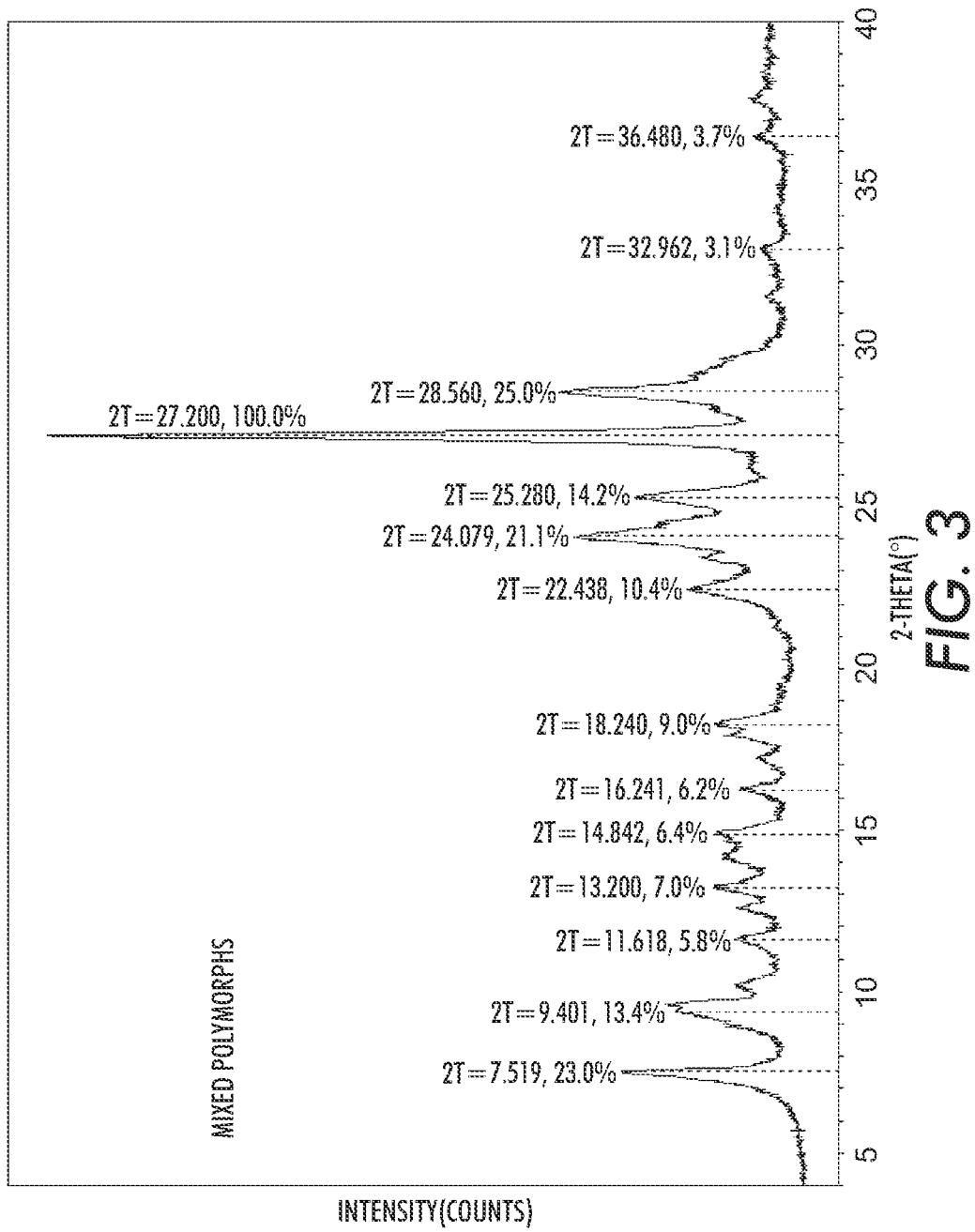
FIG. 3 is a diffractograph of the XRPD of an undesired titanyl phthalocyanine (TiOPc) obtained upon treatment with monochlorobenzene of the titanyl phthalocyanine described in FIG. 2.
Figure 4:
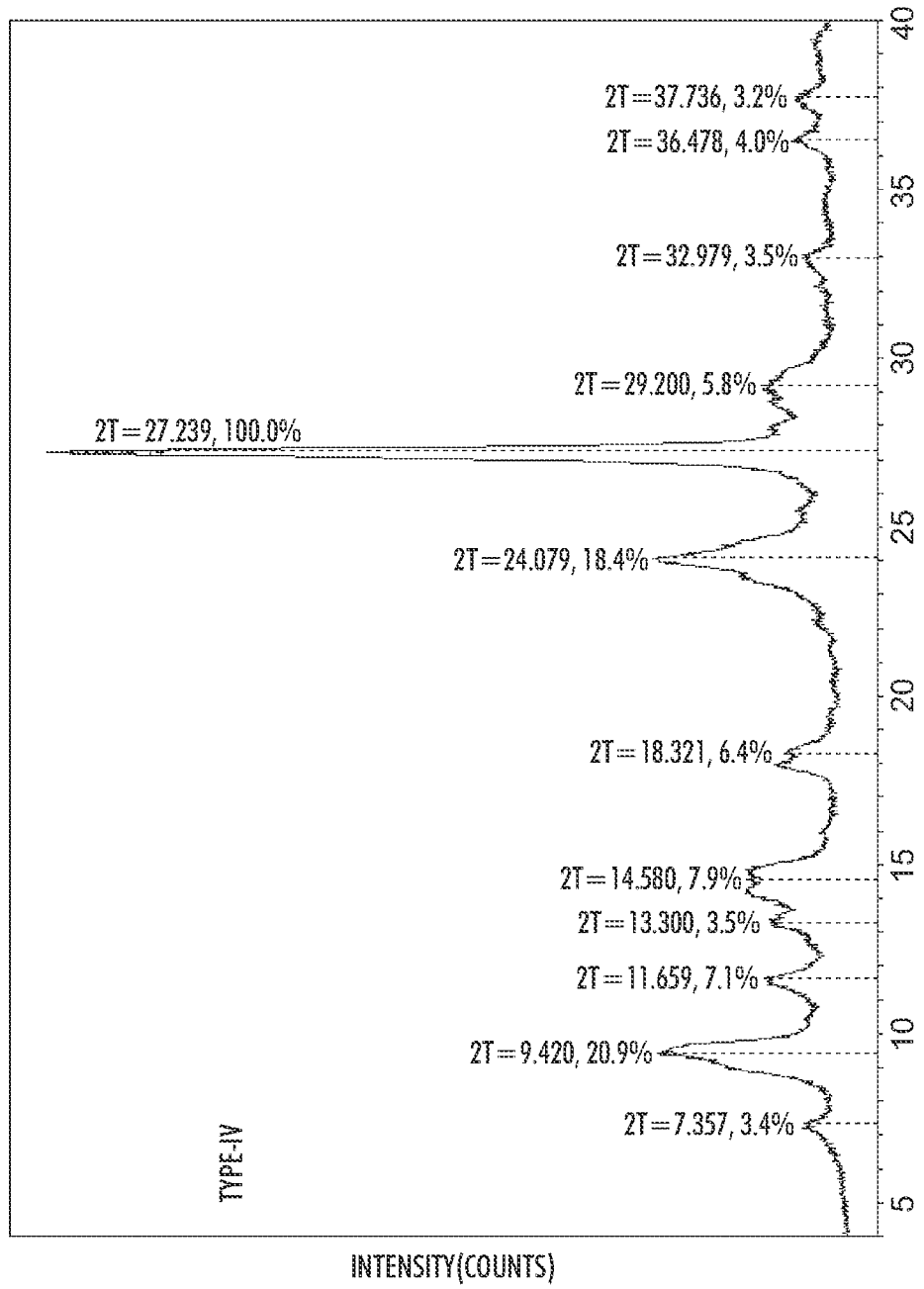
FIG. 4 is a diffractograph of the XRPD of titanyl phthalocyanine (TiOPC) Type IV obtained upon treatment with monochlorobenzene of the titanyl phthalocyanine Type X, obtained from an embodiment of the present invention.

It was discovered that when practicing a process where the pigment solution is precipitated in a mixture of organic solvents, such as methanol and methylene chloride, the crystal form of the precipitated titanyl phthalocyanine is not consistently the same. While in some cases a desired crystal form, such as TiOPC Type X was obtained, as shown by X-ray diffraction (XRPD) depicted in FIG. 1, many times a pigment with a different XRPD pattern was obtained, which is attributed to be a mixture of crystal forms (polymorphs). Such an undesired mixture of crystal form is shown in FIG. 2. Furthermore, the X-ray diffraction (XRPD) of this undesired precipitated pigment of the mixture varied from batch to batch which supports the assertion that a mixed crystal form of the pigment was obtained. The pigment lots which had the undesired XRPD pattern could not be converted by the standard monochlorobenzene treatment to a high photosensitivity crystal form of titanyl phthalocyanine, such as for example TiOPc type IV. FIG. 3 shows the XRDP pattern of such an undesired final pigment, while FIG. 4 shows the XRPD pattern of a desired high sensitivity titanyl phthalocyanine type IV.

In conducting experimental trials, changes in precipitating time, temperature, equipment standards, equipment contamination levels, and chemical and solvent lots, were shown not to affect the ability and selectivity of formation of the desired Type X polymorph. This result indicated that the resulting mixture of polymorphs after precipitation was not being caused by these variables. Subsequent testing demonstrated that by adding a small amount of water, such as de-ionized water to the non-solvent mixture of methanol/methylene chloride in the precipitation step resulted in the Type X polymorph. Additional testing using from about 0.1 percent to about 5.0 percent de-ionized water with the methanol/methylene chloride in the precipitation step consistently resulted in the pure Type X polymorph, described by the XRPD in FIG. 1. As such, "small amount" is defined in the present disclosure as less than 10.0 percent of water in the non-solvent mixture. Thus, it was discovered that adding small, controlled amounts of water, such as de-ionized water to the non-solvent mixture used for the precipitation of the pigment resulted in the formation Type X polymorph, and subsequently facilitated the production of pure, high photosensitivity, uncontaminated TiOPc Type IV pigment.

According to the present embodiments, there is provided an improved process for preparing a phthalocyanine pigment having a specific crystal form. The process comprises dissolving the pigment in a solvent mixture of a haloacetic acid and alkylene halide to form a solution, and precipitating the pigment to a specific crystal form by adding the solution to a non-solvent system, the non-solvent system comprising one or more organic solvents and a small amount of water, wherein the presence of water controls the resulting crystal form of the pigment. In this embodiment, the photosensitive phthalocyanine pigment is titanyl phthalocyanine Type X, which can be converted to the high photosensitivity titanyl phthalocyanine Type IV.

In further embodiments, there is provided a novel process for consistently producing pure TiOPc Type IV comprising dissolving TiOPc Type I in an acid and solvent to form a solution, followed by adding the solution to a non-solvent mixture, for example, methanol and methylene chloride, with a small amount of de-ionized water to precipitate TiOPc Type X. The formed Type X polymorph is subsequently washed with hot and cold de-ionized water, followed by a treatment with monochlorobenzene at a temperature of from about 20° C. to about 40° C. A final wash is done with methanol and the process is completed with drying the pigment under vacuum.

In embodiments, the small amount of de-ionized water is from about 0.1 percent to about 5.0 percent, or from about 0.5 percent to 1.0 percent. In other embodiments, the amount is from about 1.0 percent to about 5.0 percent. In embodiments, the acid used is trifluoroacetic acid (TFA). The acid may also be any haloacetic acid, and mixtures thereof. The solvent is, in particular embodiments, methylene chloride. In further embodiments, the process includes washing the formed Type X polymorph with dilute ammonia to achieve higher photosensitivity (shown in the Examples).

Moreover, by adjusting the non-solvent ratios, e.g. methanol/methylene chloride ratio, the particle size of the pigment can be controlled (shown in the Examples). The particle size of the pigments can be assessed qualitatively by transmission electron microscopy (TEM), or inferred from surface area measurements, such as BET. In the present embodiments, the non-solvent mixture has a volume to volume ratio of methanol to methylene chloride of from about 0.25:1 to about 1.5:1, or from about 0.33:1 to about 1:1.

Thus, the present embodiments provide an improved process which consistently produces the highly photosensitive pigment, TiOPc Type IV, with the desired properties such as high photosensitivity and controlled particle size.

In general embodiments, the phthalocyanine pigment made through the processes described above may be used as a photosensitive pigment in an imaging member comprising a substrate, a charge generating layer disposed on the substrate, and at least one charge transport layer disposed on the charge generating layer. The pigment is used for the charge generating layer, and may be used alone or in combination with another pigment, such as metal phthalocyanines, metal free phthalocyanines, perylenes, hydroxygallium phthalocyanines, chlorogallium phthalocyanines, methoxygallium phthalocyanines, vanadyl phthalocyanines, selenium, selenium alloys, trigonal selenium, and the like, and mixtures thereof.

The pigment may also be further mixed with a binder. Photogenerating pigments can be selected for the charge generating layer in embodiments for example of an amount of from about 10 percent by weight to about 95 percent by weight dispersed in a binder. The pigment and binder may be mixed in a desired pigment: binder ratio, for example, about 60:40. Other ratios that can be used include anywhere in between 10:90 to 90:10 pigment to binder by weight. The binder may be a binder resin, such as any inactive resin material including those described, for example, in U.S. Pat. No. 3,121,006, the entire disclosure thereof being incorporated herein by reference.

The pigment may be mixed with the binder in a solvent. It is desirable to select a coating solvent that does not substantially disturb or adversely affect the other previously coated layers of the device, such as ketones, alcohols, aromatic hydrocarbons, halogenated aliphatic hydrocarbons, ethers, amines, amides, esters, and the like.

Generally, the thickness of the charge generating layer depends on a number of factors, including the thicknesses of the other layers and the amount of photogenerator material or pigment contained in the charge generating layers.

In yet another embodiment, the photoconductive imaging member uses as hole transport molecule an aryl amine, such as N,N'-diphenyl-N,N-bis(3-methylphenyl)-1,1'-biphenyl-4,4'-diamine.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

EXAMPLES

The examples set forth herein below and are illustrative of different compositions and conditions that can be used in practicing the present embodiments. All proportions are by weight unless otherwise indicated. It will be apparent, however, that the present embodiments can be practiced with many types of compositions and can have many different uses in accordance with the disclosure above and as pointed out hereinafter.

Comparative Example 1

10 g TiOPc Type I was dissolved in a mixture of 12 ml trifluoroacetic acid (TFA) and 48 ml methylene chloride under agitation for 1 hour. The solution was then added dropwise over about 2 hours to a mixture of 300 ml methanol and 300 ml methylene chloride, kept under agitation at under −10° C. The separated pigment was filtered from the solvent, reslurried in 300 ml methanol, and filtered again to obtain a wet cake. The wet cake was reslurried in 200 ml hot deionized water at about 80° C. for 10 minutes after which the pigment was filtered off to produce a wet cake. The hot water wash and filtration was repeated two more times. The wet cake was then reslurried in 300 ml cold (room temperature) deionized water and the pigment was recovered by filtration. A small sample of the pigment taken at this time and it was dried. The XRPD of this sample is shown in FIG. 2 and it appears to indicate a mixture of polymorphs as it could not be identified with any known pure TiOPc crystal form.

The wet cake was treated with 140 g of monochlorobenzene, under agitation, at room temperature, for 1.5 hours. 50 ml methanol were added to facilitate the filtration of the pigment and the pigment was recovered as a wet cake. Two final 300 ml methanol reslurry washes and filtrations were performed, after which the pigment was dried in a vacuum oven at 65° C. The XRPD of the final pigment appears to indicate a mixture of polymorphs, as shown in FIG. 3, and evaluation of electrical properties shows a relatively low photosensitivity.

The above process was performed several times with fresh reagents and new glassware to try to eliminate any contamination. In a majority of the cases a mixture of crystal forms were obtained. Only occasionally a TiOPc Type X (XRPD shown in FIG. 1) was obtained after the water washes, which then was converted to TiOPc Type IV (XRPD shown in FIG. 4). The successful procedure could not be consistently reproduced.

Example 1

10 g TiOPc Type I was dissolved in a mixture of 12 ml trifluoroacetic acid (TFA) and 48 ml methylene chloride under agitation for 1 hour. The solution was then added dropwise over about 2 hours to a mixture of 295 ml methanol and 300 ml methylene chloride containing also 5 ml of deionized water, kept under agitation at under −10° C. The separated pigment was filtered from the solvent, reslurried in 300 ml methanol, and filtered again to obtain a wet cake. The wet cake was reslurried in 200 ml hot deionized water at about 80° C. for 10 minutes after which the pigment was filtered off to produce a wet cake. The hot water wash and filtration was repeated two more times. The wet cake was then reslurried in 300 ml cold (room temperature) deionized water and the pigment was recovered by filtration. A small sample of the pigment taken at this time and it was dried. The XRPD of this sample showed that the crystal form of the pigment is TiOPc type X as shown in FIG. 1.

The wet cake was treated with 140 g of monochlorobenzene, under agitation, at room temperature, for 1.5 hours. 50 ml methanol were added to facilitate the filtration of the pigment and the pigment was recovered as a wet cake. Two final 300 ml methanol reslurry washes and filtrations were performed, after which the pigment was dried in a vacuum oven at 65° C. The XRPD of the final pigment showed that the crystal form is that of TiOPc Type IV as shown in FIG. 4.

The above process was performed a large number of times with 100% success in obtaining the intermediate TiOPc Type X and the final desired TiOPc Type IV. Various samples of the obtained TiOPc Type IV pigment were evaluated and the electrical properties obtained are shown below in Table 1. The evaluation was conducted under the following conditions: charge generator layer formulation: 60:40 pigment (TiOPc type IV): poly(vinyl butyral) (BMS) in n-butyl acetate; charge transport layer formulation 40:60 N,N'-diphenyl-N,N-bis(3-methyl phenyl)-1,1'-biphenyl-4,4'-diamine: polycarbonate Z in monochlorobenzene; testing conditions: E=−32 V/μm; Expose$_\lambda$=780 nm; Erase$_\lambda$=600-850 nm (200-250 ergs/cm$^2$). The Control is a previously made reference sample.

TABLE 1

Electrical properties of several TiOPC Type IV pigments obtained with using about 0.5% (v/v) de-ionized water in the methanol/methylene chloride non-solvent mixture

| Sample ID | Dark Decay (500 ms)(V) | $E_{1/2}$ (ergs/cm$^2$) | $E_{7/8}$ (ergs/cm$^2$) |
| --- | --- | --- | --- |
| Control | 4.4 | 1.21 | 2.84 |
| Pigment C38F | 5.6 | 1.32 | 3.11 |
| Pigment C39F | 2.4 | 1.12 | 2.85 |
| Pigment C40F | 2.5 | 1.11 | 2.60 |
| Pigment C41F | 4.4 | 1.16 | 2.80 |
| Pigment C42F | 4.2 | 1.12 | 2.94 |
| Pigment C43F | 3.0 | 1.17 | 2.69 |
| Pigment C44F | 3.1 | 1.12 | 2.80 |
| Pigment C45F | 3.6 | 1.19 | 2.70 |
| Pigment C46F | 3.2 | 1.16 | 2.64 |
| Pigment C47F | 3.5 | 1.10 | 2.83 |

As seen from Table 1, the electrical properties of the sample pigments (C38F-C47F) are similar to the control, with some samples possibly slightly better (e.g., lower $E_{7/8}$). These pigments were all obtained with about 0.5 to about 1.0% de-ionized water added in the non-solvent mixture for precipitating the pigment.

Example 2

The same process was followed as in Example 1, however, the volume ratio (v/v) of the methanol/methylene chloride mixture used for precipitating the titanyl phthalocyanine was varied from about 0.33/1 to about 1/1 in the different samples.

It was observed that by adjusting the non-solvent ratio, the particle size of the resulting pigment can be controlled.

Figure 5:
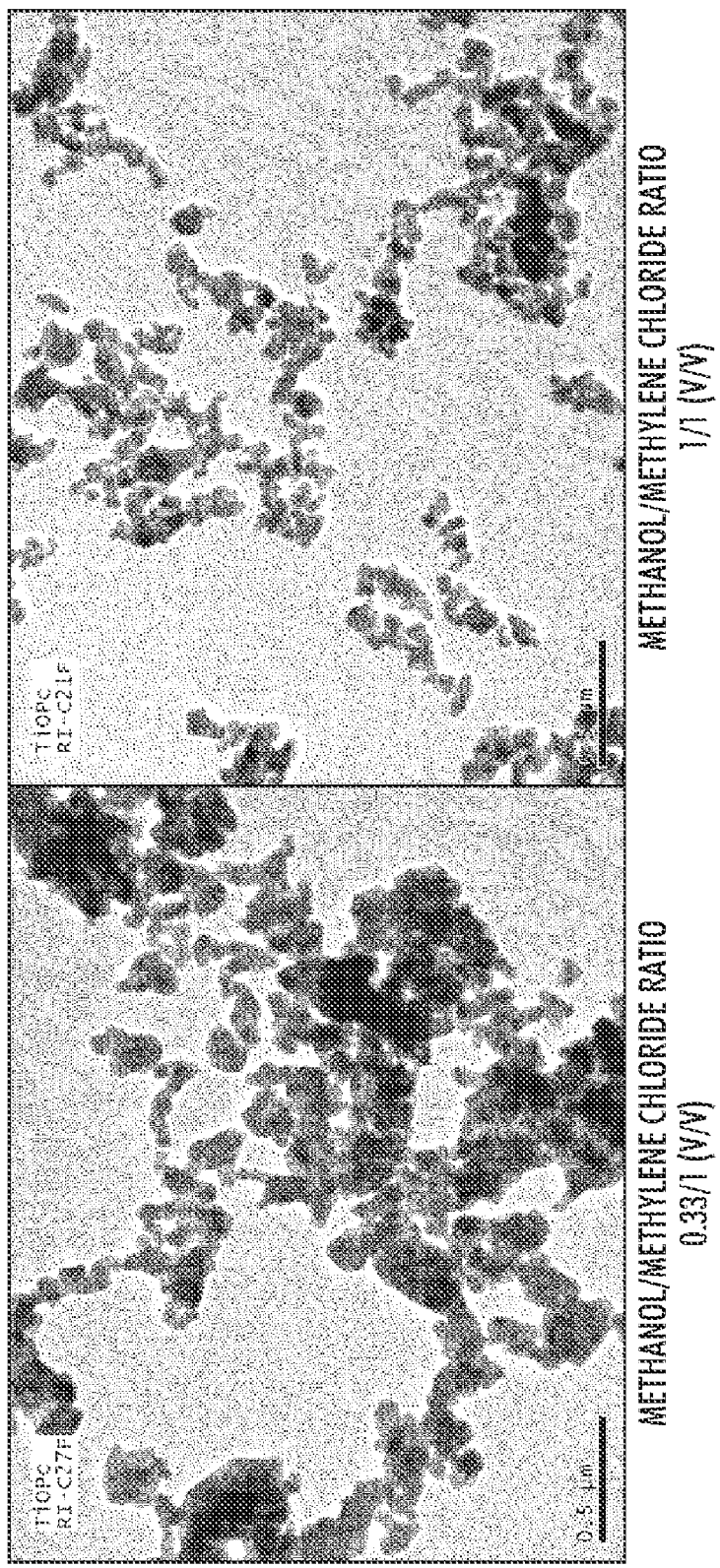
FIG. 5 is a comparison of transmission electron micrographs (TEM) of TiOPc Type IV of different particle sizes obtained by changing the non-solvent ratio.

The effect of the different ratios is shown qualitatively in the Transmission Electron Micrographs (TEMs) of the samples as illustrated in FIG. 5. However, the difference in the particle size obtained when using different non-solvent ratios can be also quantified by using pigment surface area measurements using the Brunauer, Emmett, and Teller (BET) technique. Thus, BET values are generally larger for smaller particle size, as they have a larger surface area, and smaller BET values will be obtained for larger particle size pigments. The BET data analysis was done on 12 samples obtained using two different non-solvent ratios (6 samples at 0.33/1 (v/v) ratio of methanol/methylene chloride and 6 samples at 1/1 (v/v) ratio of non-solvents). The results show a BET mean of 38.23 m$^2$/g, with a standard deviation of 3.29, for a ratio of methanol/methylene chloride of 0.33/1 (larger particle size), versus a BET mean of 48.73 m$^2$/g, with a standard deviation of 1.65, for a ratio of 1/1 (smaller particle size).

Example 3

The same process was followed as in Example 1, however, the pigment separated after precipitation in the non-solvent system was washed with dilute ammonium hydroxide before the hot de-ionized water washes. The ammonium hydroxide neutralizes the traces of trifluoroacetic acid in the pigment and the resulting pigment was shown to have higher photosensitivity. Thus, as shown in Table 2, using one ammonium hydroxide wash results in a slight increase in photosensitivity, compared to the trials when no ammonium hydroxide was used.

TABLE 2

Effect of single dilute ammonium hydroxide wash on the photosensitivity ($E_{7/8}$).

| Trials | Control | $E_{7/8}$ (ergs/cm$^2$) No NH$_4$OH wash | $E_{7/8}$ (ergs/cm$^2$) One NH$_4$OH wash |
|---|---|---|---|
| 1 | 2.84 | 3.11 | 2.6 |
| 2 | | 2.83 | 2.69 |
| 3 | | 2.80 | 2.64 |
| 4 | | — | 2.85 |
| Average | — | 2.91 | 2.70 |

All the patents and applications referred to herein are hereby specifically, and totally incorporated herein by reference in their entirety in the instant specification.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

What is claimed is:

1. A process for preparing a photosensitive phthalocyanine pigment having a specific crystal form, wherein the improvement comprises:
   (a) dissolving titanyl phthalocyanine Type I in a solvent mixture of trifluoroacetic acid and methylene chloride to form a solution;
   (b) adding the solution to a non-solvent mixture of methanol, methylene chloride and a small amount of de-ionized water to initiate precipitation of titanyl phthalocyanine Type X;
   (c) washing the titanyl phthalocyanine Type X with de-ionized water; and
   (d) treating the titanyl phthalocyanine Type X with monochlorobenzene to form titanyl phthalocyanine Type IV.

2. The process of claim 1 further including purifying the titanyl phthalocyanine Type IV by washing with methanol and drying the titanyl phthalocyanine Type IV.

3. The process of claim 1, wherein (b) is performed with the non-solvent mixture having from about 0.1 percent to about 5.0 percent de-ionized water.

4. The process of claim 1, wherein the non-solvent mixture has a volume to volume ratio of methanol to methylene chloride of from about 0.25:1 to about 1.5:1.

5. The process of claim 1, wherein a particle size of the titanyl phthalocyanine in (b) is controlled by adjusting the non-solvent ratios.

6. The process of claim 1, wherein (c) is performed with both hot and cold de-ionized water.

7. The process of claim 1, wherein (c) further includes washing with dilute ammonia to neutralize traces of the trifluoroacetic acid.

8. The process of claim 1, wherein (d) is performed at a temperature of from about 20° C. to about 40° C.

9. The process of claim 1, wherein a particle size of the titanyl phthalocyanine in (b) is controlled by adjusting the non-solvent ratios.

10. A improved process for preparing a photosensitive phthalocyanine pigment having a specific crystal form, wherein the improvement comprises:
    (a) dissolving titanyl phthalocyanine Type I in a solvent mixture of trifluoroacetic acid and methylene chloride to form a solution;
    (b) adding the solution to a non-solvent mixture of methanol, methylene chloride and a small amount of de-ionized water to initiate precipitation of titanyl phthalocyanine Type X; and
    (c) using the amount of water to control the resulting crystal form of the pigment.

11. The process of claim 10 further including purifying the titanyl phthalocyanine Type IV by washing with methanol and drying the titanyl phthalocyanine Type IV.

12. The process of claim 10, wherein (b) is performed with the non-solvent mixture having from about 0.1 percent to about 5.0 percent de-ionized water.

13. The process of claim 10, wherein the non-solvent mixture has a volume to volume ratio of methanol to methylene chloride of from about 0.25:1 to about 1.5:1.

14. The process of claim 10, wherein a particle size of the titanyl phthalocyanine in (b) is controlled by adjusting the non-solvent ratios.

15. A process for preparing a photosensitive phthalocyanine pigment having a specific crystal form, wherein the improvement comprises:
    (a) dissolving titanyl phthalocyanine Type I in a solvent mixture of trifluoroacetic acid and methylene chloride to form a solution;
    (b) adding the solution to a non-solvent mixture of methanol, methylene chloride and a small amount of de-ionized water to initiate precipitation of titanyl phthalocyanine Type X;

(c) adjusting a ratio of methanol to methylene chloride in the non-solvent mixture to control particle size of the titanyl phthalocyanine Type X;

(d) washing the titanyl phthalocyanine Type X with de-ionized water; and (e) treating the titanyl phthalocyanine Type X with monochlorobenzene to form titanyl phthalocyanine Type IV.

16. The process of claim 15 further including purifying the titanyl phthalocyanine Type IV by washing with methanol and drying the titanyl phthalocyanine Type IV.

17. The process of claim 15, wherein the non-solvent mixture has a volume to volume ratio of methanol to methylene chloride of from about 0.25:1 to about 1.5:1.

18. The process of claim 15, wherein (d) is performed with both hot and cold de-ionized water.

19. The process of claim 15, wherein (d) further includes washing with dilute ammonia to neutralize traces of the trifluoroacetic acid.

20. The process of claim 15, wherein (e) is performed at a temperature of from about 20° C. to about 40° C.

* * * * *